US006345685B1

(12) United States Patent
Wells et al.

(10) Patent No.: US 6,345,685 B1
(45) Date of Patent: Feb. 12, 2002

(54) LOUDSPEAKER SYSTEM

(76) Inventors: Leigh D. Wells; Emma-Jane Smith, both of Providence Cottage, Beacon Hill, Trellech Monmouthshire, Wales NP25 4QB (GB)

( * ) Notice: Subject to any disclaimer, the term of this patent is extended or adjusted under 35 U.S.C. 154(b) by 0 days.

(21) Appl. No.: 09/653,514

(22) Filed: Aug. 31, 2000

(30) Foreign Application Priority Data

Jan. 26, 2000 (GB) ........................................ 0001721

(51) Int. Cl.[7] .............................................. H05K 5/00
(52) U.S. Cl. ...................... 181/153; 181/156; 181/199
(58) Field of Search ............................... 181/144, 148, 181/153, 155, 156, 196, 199; 381/339, 352, 160, 386, 388, 395

(56) References Cited

U.S. PATENT DOCUMENTS 4,298,087 A 11/1981 Launay
5,426,707 A 6/1995 Wijnker
D360,635 S 7/1995 Mark
5,710,395 A 1/1998 Wilke
5,886,304 A 3/1999 Schlenzing et al.
5,889,877 A 3/1999 Bunzow
5,995,634 A * 11/1999 Zwolski ..................... 381/160

* cited by examiner

*Primary Examiner*—Khanh Dang

(57) ABSTRACT

A loudspeaker system for providing a self-contained light and sound system for entertainment. The loudspeaker system includes a loudspeaker system comprising of a housing unit attached to a cage comprising of a plurality of rods and two rim members by means of a plurality of fasteners attached to the top rim member. There is a tubular enclosure inside of the cage which is at least part transparent to varying degrees of opacity, sandwiched between the bottom rim member and the housing unit with countersunk gaskets to seal the tubular enclosure. The bottom rim member has mounted into it a loudspeaker driver and legs to elevate the loudspeaker system. When the unit is detached from the top rim member of the cage the transparent tubular enclosure is released. The housing unit contains a light emitting source, additional speakers and other associated electrical components. There are detachable audio and electrical connections between the housing unit and cage. The light created in the housing unit passes through a lens at the bottom of the housing unit into the tubular enclosure where a deflector/diffuser is situated at the rear of the loudspeaker driver deflecting the light onto and through the tubular enclosure walls.

12 Claims, 8 Drawing Sheets

LOUDSPEAKER SYSTEM

BACKGROUND OF THE INVENTION

1. Field of the Invention

The present invention relates to a light and sound system and more particularly pertains to a new loudspeaker system for providing a self-contained light and sound system for entertainment.

2. Description of the Prior Art

The use of a light and sound system is known in the prior art. More specifically, a light and sound system heretofore devised and utilized are known to consist basically of familiar, expected and obvious structural configurations, notwithstanding the myriad of designs encompassed by the crowded prior art which have been developed for the fulfillment of countless objectives and requirements.

Known prior art includes U.S. Pat. No. 5,886,304; U.S. Pat. No. 5,889,877; U.S. Pat. No. 5,710,395; U.S. Pat. No. 5,426,707; U.S. Pat. No. 4,298,087; and U.S. Pat. No. Des. 360,635.

While these devices fulfill their respective, particular objectives and requirements, the aforementioned patents do not disclose a new loudspeaker system. The inventive device includes a loudspeaker system comprising of a housing unit attached to a cage comprising of a plurality of rods and two rim members by means of a plurality of fasteners attached to the top rim member. There is a tubular enclosure inside of the cage which is at least part transparent to varying degrees of opacity, sandwiched between the bottom rim member and the housing unit with countersunk gaskets to seal the tubular enclosure. The bottom rim member has mounted into it a loudspeaker driver and legs to elevate the loudspeaker system. When the unit is detached from the top rim member of the cage the transparent tubular enclosure is released. The housing unit contains a light emitting source, additional speakers and other associated electrical components. There are detachable audio and electrical connections between the housing unit and cage. The light created in the housing unit passes through a lens at the bottom of the housing unit into the tubular enclosure where a deflector/diffuser is situated at the rear of the loudspeaker driver deflecting the light onto and through the tubular enclosure walls.

In these respects, the loudspeaker system according to the present invention substantially departs from the conventional concepts and designs of the prior art, and in so doing provides an apparatus primarily developed for the purpose of providing a self-contained light and sound system for entertainment.

SUMMARY OF THE INVENTION

In view of the foregoing disadvantages inherent in the known types of light and sound system now present in the prior art, the present invention provides a new loudspeaker system construction wherein the same can be utilized for providing a self-contained light and sound system for entertainment.

The general purpose of the present invention, which will be described subsequently in greater detail, is to provide a new loudspeaker system which has many of the advantages of the light and sound system mentioned heretofore and many novel features that result in a new loudspeaker system which is not anticipated, rendered obvious, suggested, or even implied by any of the prior art light and sound system, either alone or in any combination thereof.

To attain this, the present invention generally comprises a loudspeaker system comprising of a housing unit attached to a cage comprising of a plurality of rods and two rim members by means of a plurality of fasteners attached to the top rim member. There is a tubular enclosure inside of the cage which is at least part transparent to varying degrees of opacity, sandwiched between the bottom rim member and the housing unit with countersunk gaskets to seal the tubular enclosure. The bottom rim member has mounted into it a loudspeaker driver and legs to elevate the loudspeaker system. When the unit is detached from the top rim member of the cage the transparent tubular enclosure is released. The housing unit contains a light emitting source, additional speakers and other associated electrical components. There are detachable audio and electrical connections between the housing unit and cage. The light created in the housing unit passes through a lens at the bottom of the housing unit into the tubular enclosure where a deflector/diffuser is situated at the rear of the loudspeaker driver deflecting the light onto and through the tubular enclosure walls.

There has thus been outlined, rather broadly, the more important features of the invention in order that the detailed description thereof that follows may be better understood, and in order that the present contribution to the art may be better appreciated. There are additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new loudspeaker system which has many of the advantages of the light and sound system mentioned heretofore and many novel features that result in a new loudspeaker system which is not anticipated, rendered obvious, suggested, or even implied by any of the prior art light and sound system, either alone or in any combination thereof.

It is another object of the present invention to provide a new loudspeaker system which may be easily and efficiently manufactured and marketed.

It is a further object of the present invention to provide a new loudspeaker system which is of a durable and reliable construction.

An even further object of the present invention is to provide a new loudspeaker system which is susceptible of a low cost of manufacture with regard to both materials and labor, and which accordingly is then susceptible of low prices of sale to the consuming public, thereby making such loudspeaker system economically available to the buying public.

Still yet another object of the present invention is to provide a new loudspeaker system which provides in the apparatuses and methods of the prior art some of the advantages thereof, while simultaneously overcoming some of the disadvantages normally associated therewith.

Still another object of the present invention is to provide a new loudspeaker system for providing a self-contained light and sound system for entertainment.

Yet another object of the present invention is to provide a new loudspeaker system which includes a loudspeaker system comprising of a housing unit attached to a cage comprising of a plurality of rods and two rim members by means of a plurality of fasteners attached to the top rim member. There is a tubular enclosure inside of the cage which is at least part transparent to varying degrees of opacity, sandwiched between the bottom rim member and the housing unit with countersunk gaskets to seal the tubular enclosure. The bottom rim member has mounted into it a loudspeaker driver and legs to elevate the loudspeaker system. When the unit is detached from the top rim member of the cage the transparent tubular enclosure is released. The housing unit contains a light emitting source, additional speakers and other associated electrical components. There are detachable audio and electrical connections between the housing unit and cage. The light created in the housing unit passes through a lens at the bottom of the housing unit into the tubular enclosure where a deflector/diffuser is situated at the rear of the loudspeaker driver deflecting the light onto and through the tubular enclosure walls.

Still yet another object of the present invention is to provide a new loudspeaker system that offers a multi-functional use of light and sound to the environment.

Even still another object of the present invention is to provide a new loudspeaker system that is modular and can incorporate any type of lighting system without affecting the acoustics because the source of light and its components are housed in separate compartments from the main tubular enclosure.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be made to the accompanying drawings and descriptive matter in which there are illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein.

DESCRIPTION OF THE PREFERRED EMBODIMENT

Figure 1:
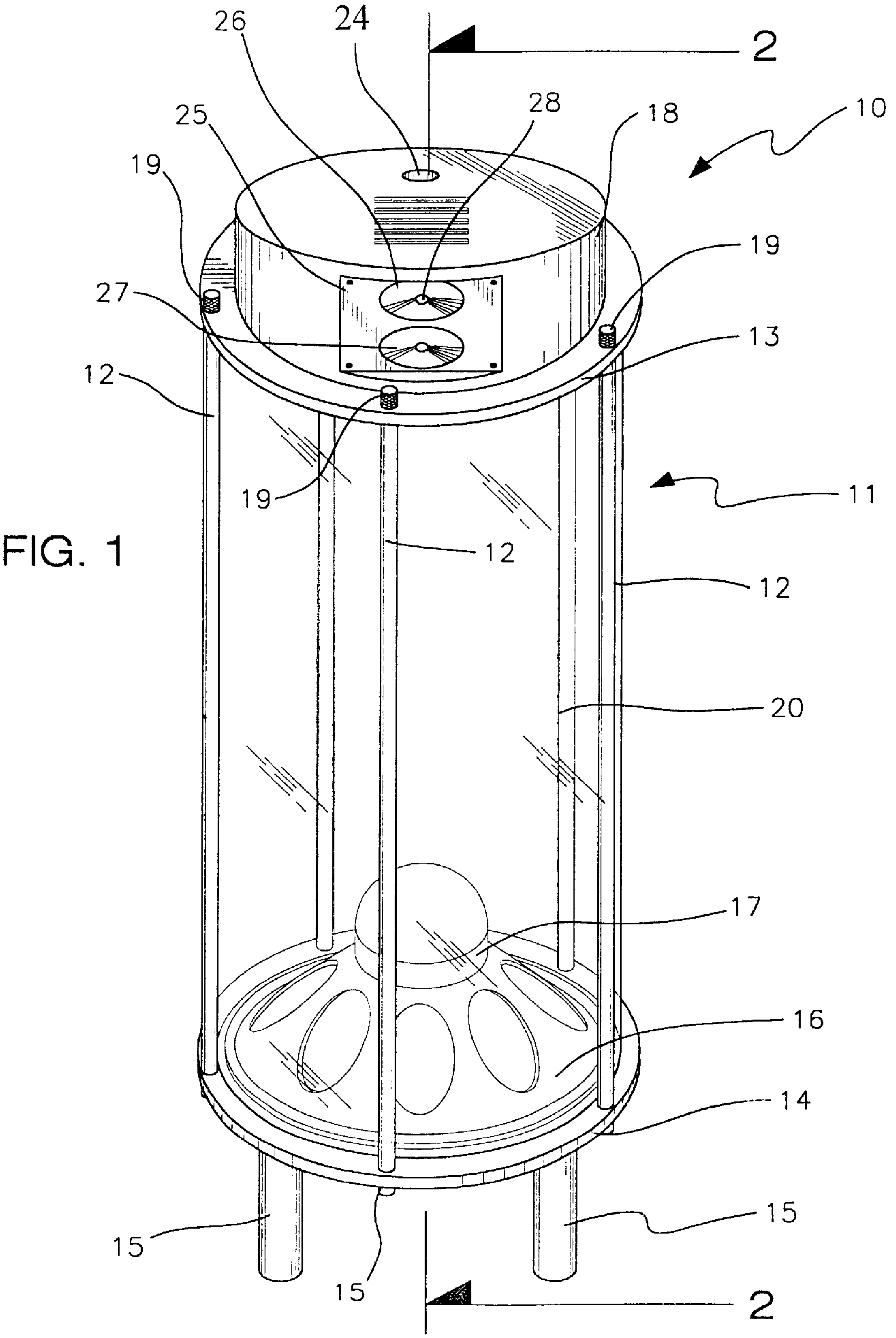
FIG. 1 is a perspective view of a new loudspeaker system according to the present invention.
Figure 2:
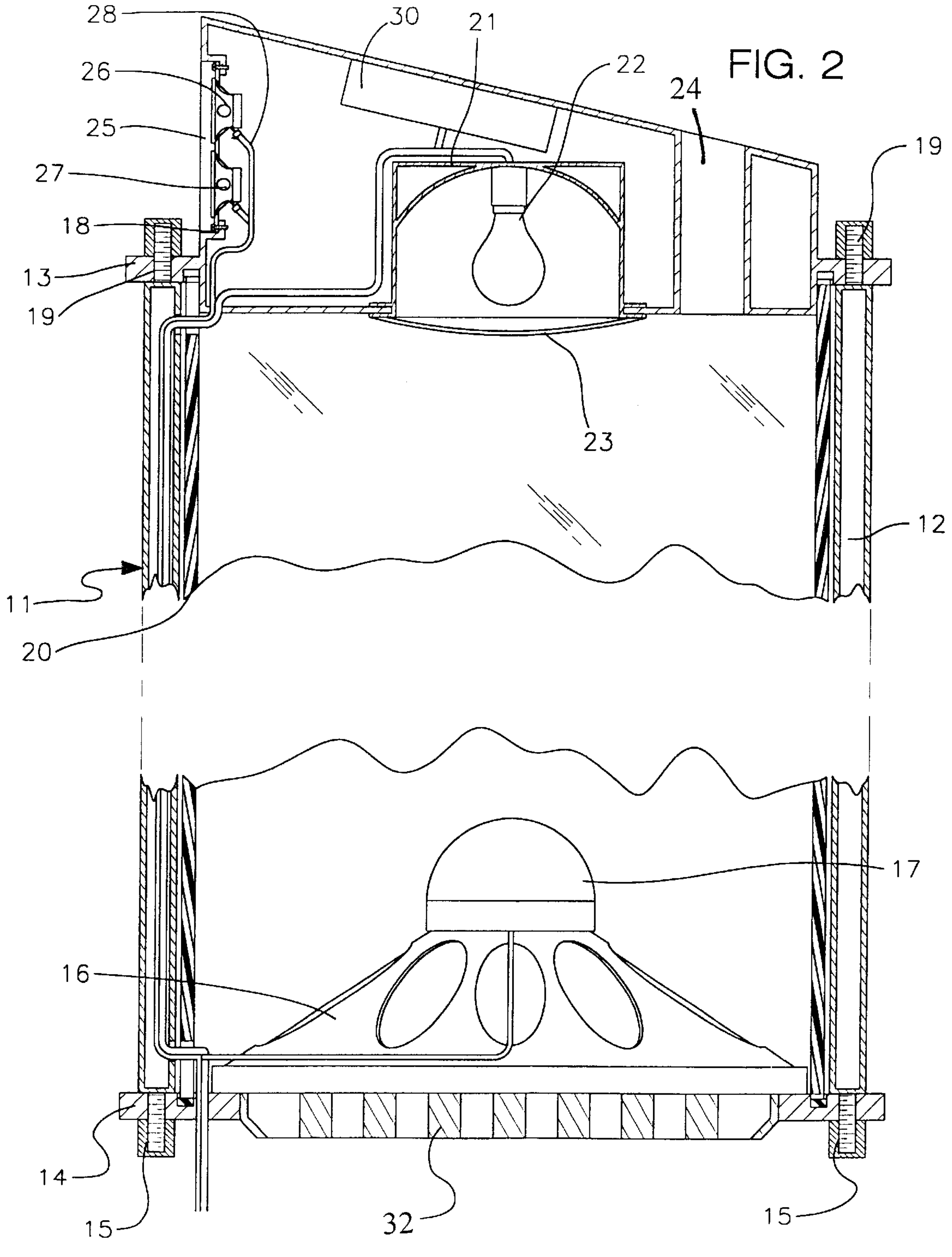
FIG. 2 is a cross-sectional view of the present invention.
Figure 3:
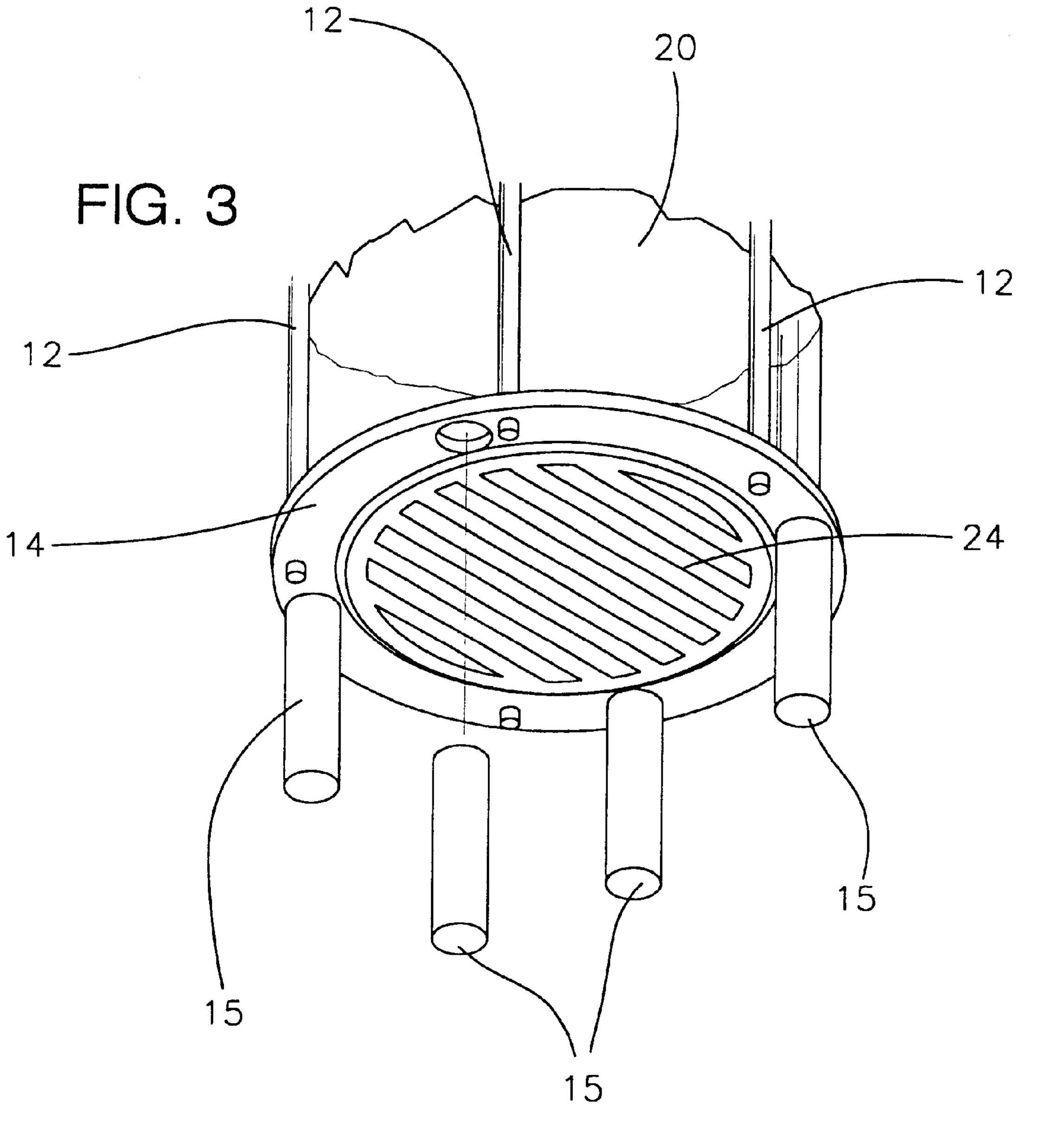
FIG. 3 is a partial perspective view of the bottom rim member including legs of the present invention.
Figure 4:
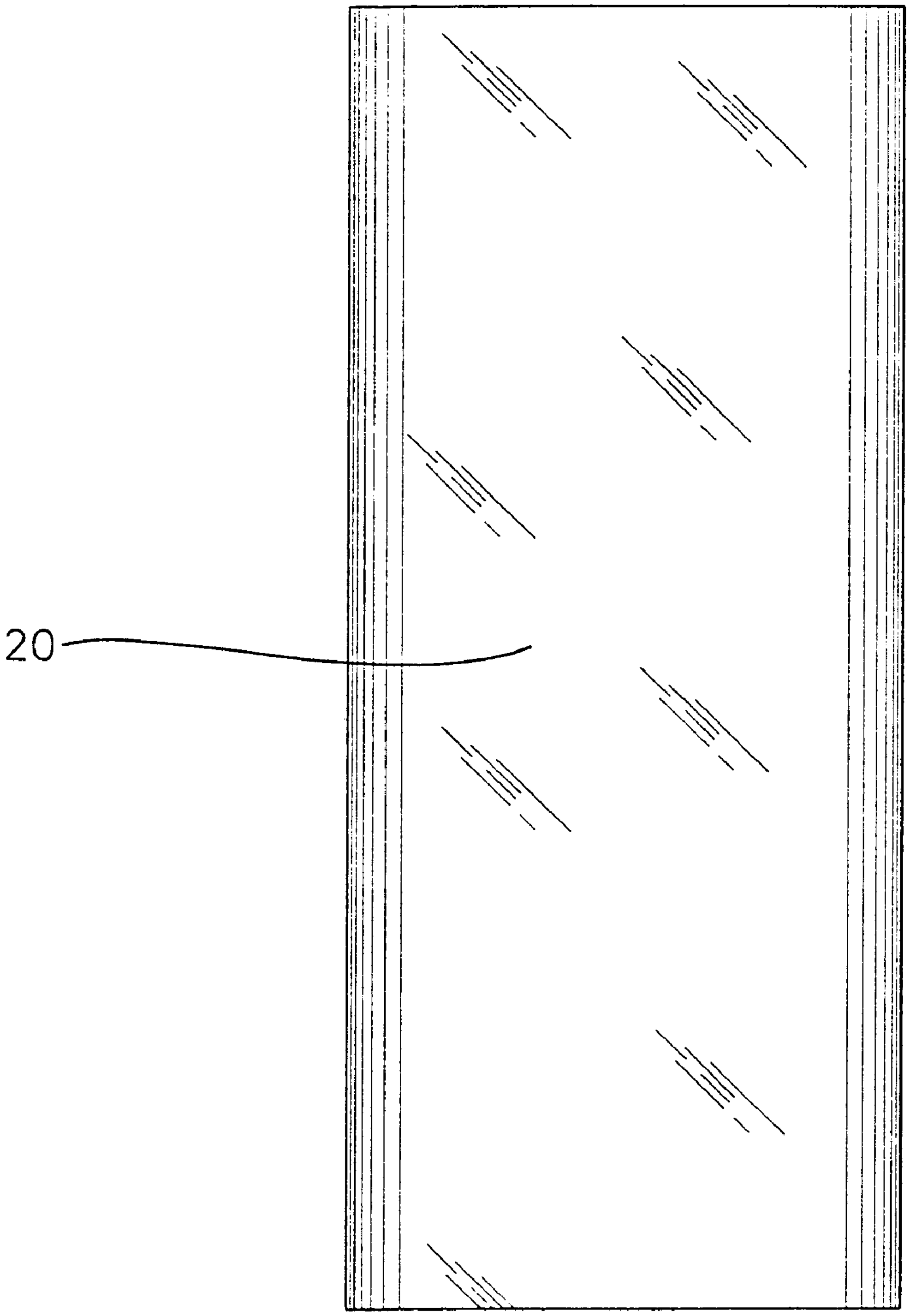
FIG. 4 is a side elevational view of the tubular member of the present invention.
Figure 5:
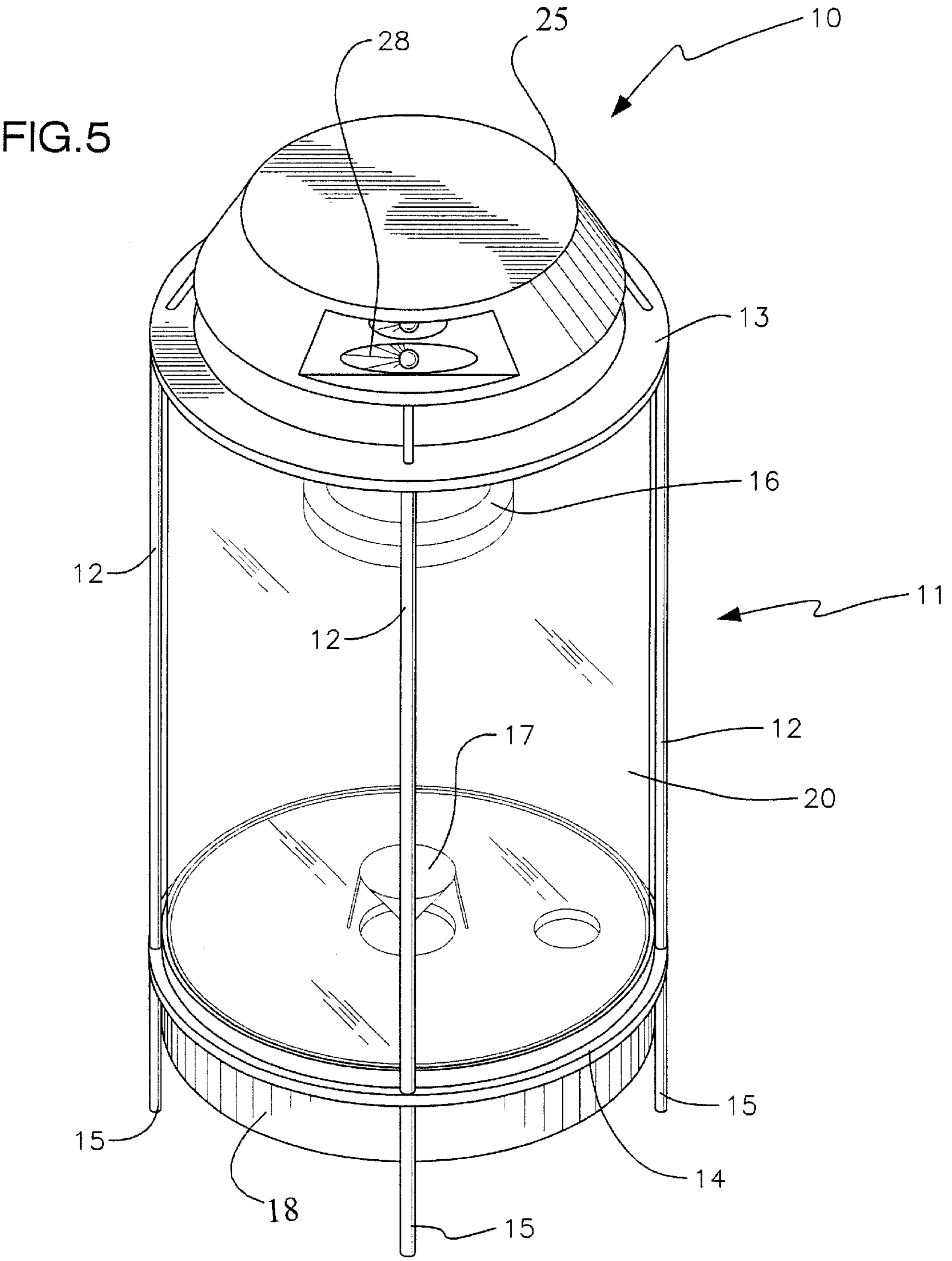
FIG. 5 is a perspective view of a second embodiment of the present invention.
Figure 6:
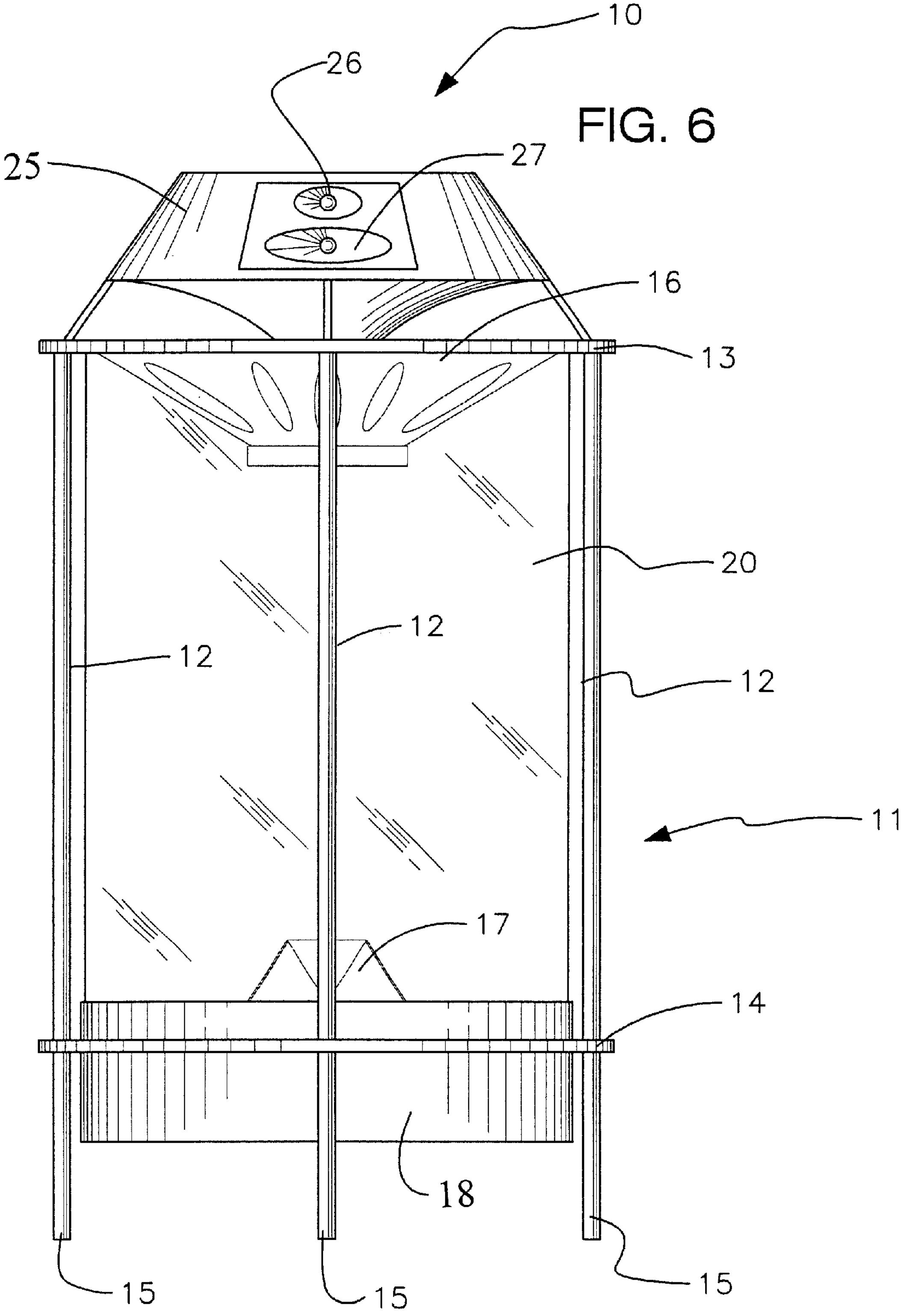
FIG. 6 is a side elevational view of the second embodiment of the present invention.
Figure 7:
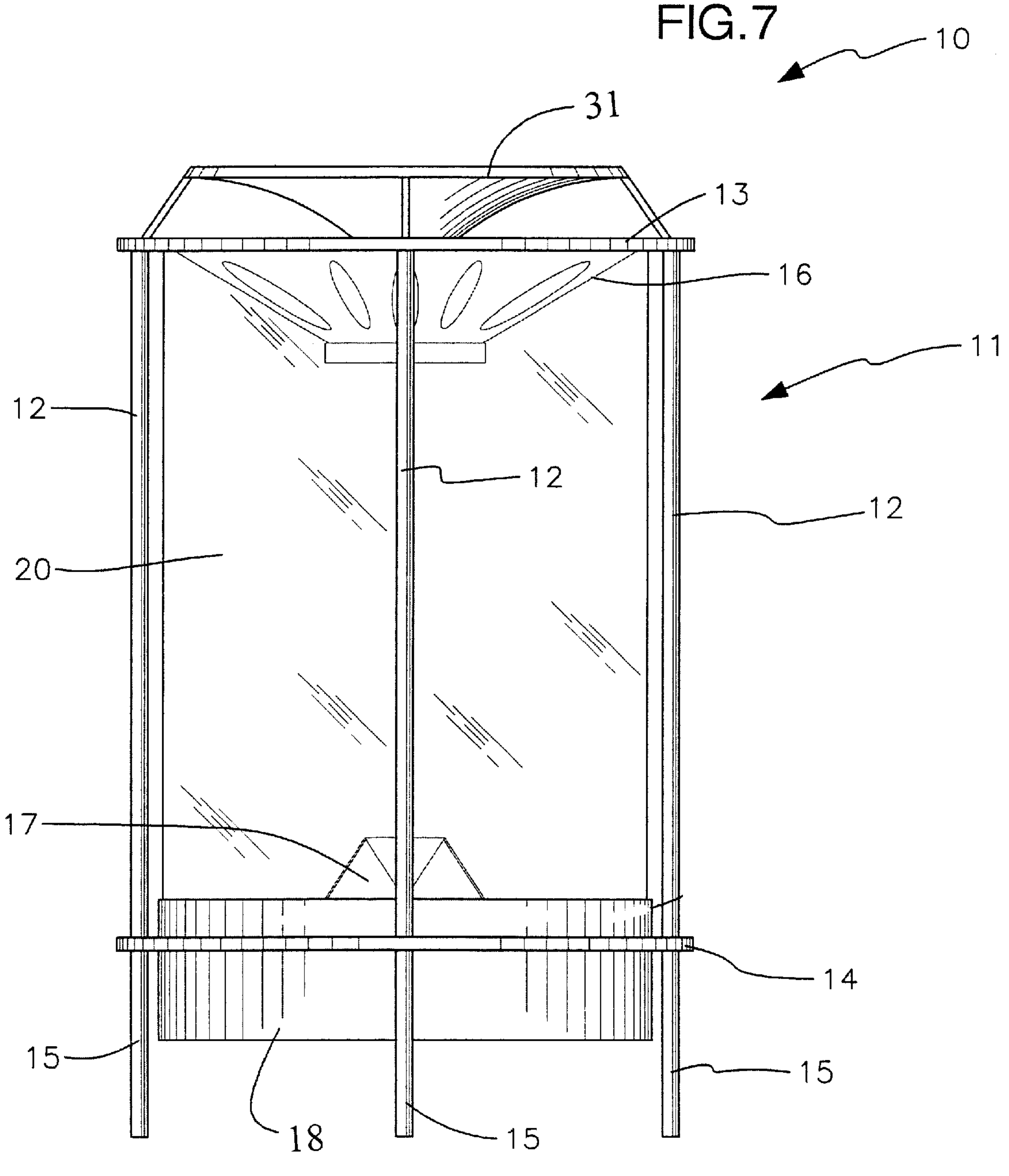
FIG. 7 is a side elevational view of a third embodiment of the present invention.
Figure 8:
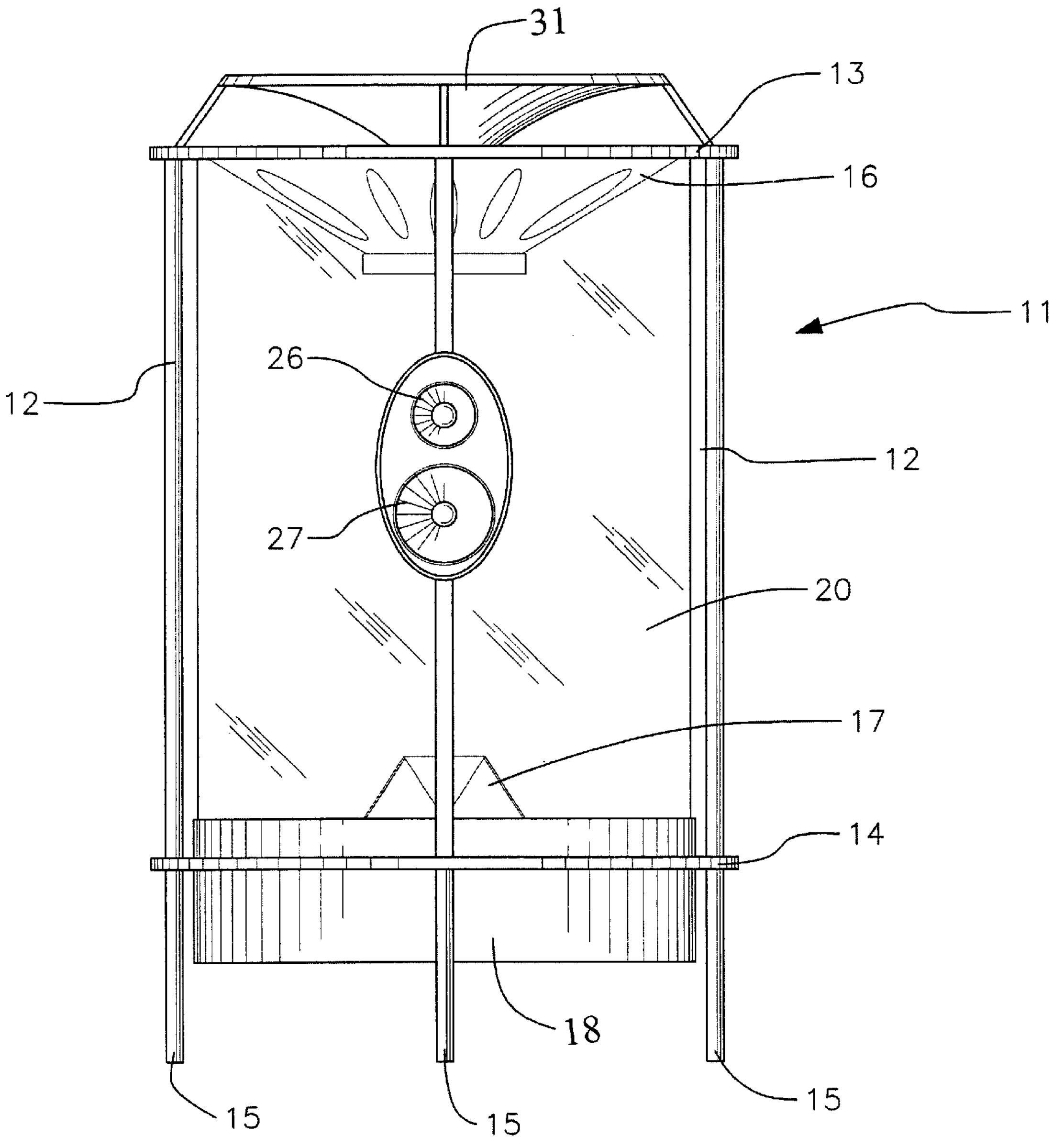
FIG. 8 is a side elevational view of a fourth embodiment of the present invention.

With reference now to the drawings, and in particular to FIGS. 1 through 8 thereof, a new loudspeaker system embodying the principles and concepts of the present invention and generally designated by the reference numeral 10 will be described.

As best illustrated in FIGS. 1 through 8, the loudspeaker system 10 generally comprises comprising a cage 11 formed from a plurality of rods 12 and two rim members 13,14 with leg members 15 securely and conventionally attached to a bottom rim member 14 for elevating the loudspeaker system. A sub-woofer loudspeaker driver 16 is securely mounted upon the bottom rim member 14, and a grill 32 is securely attached to the bottom rim member 14 between the leg members 15. A reflector/diffuser 17 is securely attached to a back of the sub-woofer loudspeaker driver 16 and is disposed in the cage 11. The top rim member 13 has a housing unit 18 attached to it with fastening members 19. An open-ended tubular enclosure 20 being at least part transparent to varying degrees of opacity is protected inside the cage 11 and is sandwiched between the bottom rim 14 and the bottom of the housing unit 18 with countersunk gaskets (not shown) to seal the tubular enclosure 20. The tubular enclosure 20 is released when the housing unit 18 is removed from the cage 11. The housing unit 18 includes electrical components 21 to power a light-emitting member 22 disposed inside thereof. Also a fan 30 is securely mounted within the housing unit 18 to cool the components. A lens 23 is securely disposed in a bottom wall of the housing unit 18, and a vent 24 is disposed through said housing unit 18 to allow air pressure created within the tubular enclosure 20 by the sub-woofer loudspeaker driver 16 to escape through the housing unit 18. A compartment member 25 is attached to the housing unit 18 and contains loudspeakers mid-range 26, tweeter 27 and passive crossover 28. This compartment member 25 is detachable from the housing unit 18. There are audio and electrical signal connections (not shown) conventionally disposed between the housing unit 18 and cage 11. Light created within the housing unit 18 passes through the lens 23 into the tubular enclosure 20 and onto a reflective surface reflector/diffuser 17 which deflects/diffuses light onto and through the walls of tubular enclosure 20. The open-ended tubular enclosure 20 may be clear or colored and may vary in transparency over its surface area. In particular, the tubular enclosure 20 may be patterned, e.g. by sand-blasting or etching. Also, the loudspeaker system 10 which has been described may be a free standing or be suspended in a fixed position from either a static or mobile frame. As another embodiment, the loudspeaker system includes a deflection member 31 having a tip and being securely and conventionally disposed with said tip being opposite said loudspeaker driver 16.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

We claim:

1. A loudspeaker system comprising:

an open ended tubular enclosure surrounded by a cage being formed from a plurality of rods and rim members;

loudspeaker drivers being mounted upon one of said rim members;

a reflector/deflector being mounted upon one of said loudspeaker drivers; and a housing unit being disposed upon another of said rim members and having a light-emitting member disposed therein with light radiating onto and through walls of said tubular enclosure.

2. A loudspeaker system as claimed in claim 1, further comprises a plurality of fastening members which attach said housing unit to said cage.

3. A loudspeaker system as claimed in claim 2, said open ended tubular enclosure is removable from inside said cage.

4. A loudspeaker system as claimed in claim 3, further includes electrical and audio connections being disposed upon and in said housing unit to allow detachability.

5. A loudspeaker system as claimed in claim 4, said ends of said open ended tubular enclosure are partially sunk into a groove with a gasket disposed therein.

6. A loudspeaker system as claimed in claim 5, said loudspeakers drivers include midrange and treble speakers which are removably and securely disposed in said housing unit.

7. A loudspeaker system as claimed in claim 6, further includes leg members being securely attached to a bottom one of said rim members for elevating said loudspeaker system upon a surface.

8. A loudspeaker system as claimed in claim 7, further comprises a fan disposed in said housing unit to cool components therein.

9. A loudspeaker system as claimed in claim 8, wherein the bottom one of said rim member includes a vent which is disposed through thereof.

10. A loudspeaker system as claimed in claim 9, wherein said loudspeaker system is made from metals, plastics, glass, wood, man-made or natural composites, or combinations of these.

11. A loudspeaker system comprising:

an open ended tubular enclosure surrounded by a cage being formed from a plurality of rods and rim members, said open ended tubular enclosure being removable from inside said cage, said ends of said open ended tubular enclosure are partially sunk into a groove with a gasket disposed therein;

loudspeaker drivers being mounted upon one of said rim members, said loudspeakers drivers including midrange and treble speakers which are removably and securely disposed in said housing unit, a bottom one of said rim members having a vent therethrough;

a reflector/deflector being mounted upon one of said loudspeaker drivers;

a housing unit being disposed upon another of said rim members and having a light-emitting member disposed therein with light radiating onto and through walls of said tubular enclosure;

a plurality of fastening members which attach said housing unit to said cage;

electrical and audio connections being disposed upon and in said housing unit to allow detachability;

leg members being securely attached to the bottom one of said rim members for elevating said loudspeaker system upon a surface; and a fan disposed in said housing unit to cool components therein, said loudspeaker system being made from metals, plastics, glass, wood, man-made or natural composites, or combinations of these.

12. A loudspeaker system comprising:

an open ended tubular enclosure surrounded by a cage being formed from a plurality of rods and rim members, said open ended tubular enclosure being removable from inside said cage, said ends of said open ended tubular enclosure are partially sunk into a groove with a gasket disposed therein;

loudspeaker drivers being mounted upon one of said rim members, a deflection member having a tip and being mounted with said tip being opposite said loudspeaker driver;

a reflector/deflector being mounted upon one of said loudspeaker drivers;

a housing unit being disposed upon another of said rim members and having a light-emitting member disposed therein with light radiating onto and through walls of said tubular enclosure;

a plurality of fastening members which attach said housing unit to said cage;

electrical and audio connections being disposed upon and in said housing unit to allow detachability;

leg members being securely attached to the bottom one of said rim members for elevating said loudspeaker system upon a surface; and a fan disposed in said housing unit to cool components therein, said loudspeaker system being made from metals, plastics, glass, wood, man-made or natural composites, or combinations of these.

* * * * *